US012160244B2

(12) United States Patent
Zhou et al.

(10) Patent No.: US 12,160,244 B2
(45) Date of Patent: Dec. 3, 2024

(54) DIGITAL-TO-ANALOG CONVERTER (DAC) WITH ADAPTIVE CALIBRATION SCHEME

(71) Applicant: QUALCOMM Incorporated, San Diego, CA (US)

(72) Inventors: Xiahan Zhou, San Diego, CA (US); Haibo Fei, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 124 days.

(21) Appl. No.: 17/806,679

(22) Filed: Jun. 13, 2022

(65) Prior Publication Data
US 2023/0403022 A1    Dec. 14, 2023

(51) Int. Cl.
*H03M 1/00* (2006.01)
*H03M 1/10* (2006.01)
*H03M 1/66* (2006.01)

(52) U.S. Cl.
CPC ........... *H03M 1/1042* (2013.01); *H03M 1/66* (2013.01)

(58) Field of Classification Search
CPC .... H03M 1/742; H03M 1/0863; H03M 1/747; H03M 1/745; H03M 1/0604; H03M 1/1009; H03M 1/66; H03M 1/687; H03M 1/06; H03M 1/0818; H03M 1/0836; H03M 1/0872; H03M 1/1014; H03M 3/464
USPC .................................. 341/118–121, 144, 153
See application file for complete search history.

(56) References Cited

U.S. PATENT DOCUMENTS

| | | | | |
|---|---|---|---|---|
| 5,825,317 A | * | 10/1998 | Anderson | H03M 1/1057 341/120 |
| 6,211,583 B1 | * | 4/2001 | Humphreys | H03K 17/04106 307/131 |
| 6,353,402 B1 | * | 3/2002 | Kanamori | H03M 1/002 341/118 |
| 6,664,906 B2 | * | 12/2003 | Volk | H03M 1/0624 341/118 |
| 6,927,714 B1 | * | 8/2005 | Teterwak | H03M 1/0604 341/144 |
| 7,023,367 B1 | * | 4/2006 | Manganaro | H03M 1/0614 341/144 |
| 7,796,073 B2 | * | 9/2010 | Ogawa | H03K 17/302 341/120 |
| 7,889,106 B2 | * | 2/2011 | Imai | G05F 3/262 341/144 |

(Continued)

OTHER PUBLICATIONS

International Search Report and Written Opinion—PCT/US2023/066985—ISA/EPO—Sep. 11, 2023.

*Primary Examiner* — Linh V Nguyen
(74) *Attorney, Agent, or Firm* — Patterson+ Sheridan, L.L.P.

(57) ABSTRACT

Methods and apparatus for controlling a power supply voltage for a switch driver in a digital-to-analog converter (DAC). An example DAC generally includes a plurality of DAC cells, each DAC cell comprising a current source, a first switch coupled in series with the current source at a first node, and a switch driver having an output coupled to a control input of the first switch; and calibration circuitry having a first input coupled to a first DAC cell in the plurality of DAC cells and having an output coupled to at least one of the plurality of DAC cells, the calibration circuitry being configured to sense a voltage of the first node in the first DAC cell and to control the power supply voltage for the switch driver in the at least one of the plurality of DAC cells, based on the sensed voltage of the first node.

26 Claims, 7 Drawing Sheets

(56) References Cited

U.S. PATENT DOCUMENTS

| | | | |
|---|---|---|---|
| 8,330,633 B2 * | 12/2012 | Brubaker | H03K 17/693 341/144 |
| 8,537,043 B1 * | 9/2013 | McLachlan | H03K 17/063 375/232 |
| 2017/0331487 A1 * | 11/2017 | Kim | H03M 1/1009 |
| 2021/0391871 A1 | 12/2021 | Liu et al. | |

* cited by examiner

DIGITAL-TO-ANALOG CONVERTER (DAC) WITH ADAPTIVE CALIBRATION SCHEME

TECHNICAL FIELD

Certain aspects of the present disclosure generally relate to electronic circuits and, more particularly, to techniques and apparatus for controlling a power supply voltage for a switch driver in a digital-to-analog converter (DAC).

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include a transmission digital-to-analog converter (TX DAC), which may be used, for example, to convert a digital signal to an analog signal for signal processing (e.g., filtering, upconverting, and amplifying) before transmission by one or more antennas.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include lower distortion over operation corners, without significantly increasing area or power consumption of a digital-to-analog converter (DAC).

Certain aspects of the present disclosure provide a DAC. The DAC generally includes a plurality of DAC cells, each DAC cell comprising a current source, a first switch coupled in series with the current source at a first node, and a switch driver having an output coupled to a control input of the first switch. The DAC also generally includes calibration circuitry having a first input coupled to a first DAC cell in the plurality of DAC cells and having an output coupled to at least one of the plurality of DAC cells. The calibration circuitry may be configured to sense a voltage of the first node in the first DAC cell and to control a power supply voltage for the switch driver in the at least one of the plurality of DAC cells, based on the voltage of the first node in the first DAC cell Certain aspects of the present disclosure provide a wireless device. The wireless device includes the DAC as described herein, one or more antennas, and one or more transmit paths coupled between one or more outputs of the DAC and the one or more antennas.

Certain aspects of the present disclosure provide a method of operating a DAC. The DAC generally includes a plurality of DAC cells, each DAC cell comprising a current source, a switch coupled in series with the current source at a first node, and a switch driver having an output coupled to a control input of the first switch. The method generally includes controlling a power supply voltage for the switch driver in at least one of the plurality of DAC cells, based on a voltage of the first node in a first DAC cell.

Certain aspects of the present disclosure provide an apparatus for digital-to-analog conversion. The apparatus generally includes a plurality of DAC cells, each DAC cell comprising means for sourcing current, means for switching coupled in series with the means for sourcing current at a node, and means for driving the means for switching. The apparatus also includes means for controlling a power supply voltage for the means for driving the means for switching in at least one of the plurality of DAC cells, based on a voltage of the node in a first DAC cell.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to techniques and apparatus for adaptively adjusting (e.g., calibrating) a power supply voltage (e.g., a reference potential) for a switch driver in a digital-to-analog converter (DAC), such as a current-steering DAC.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
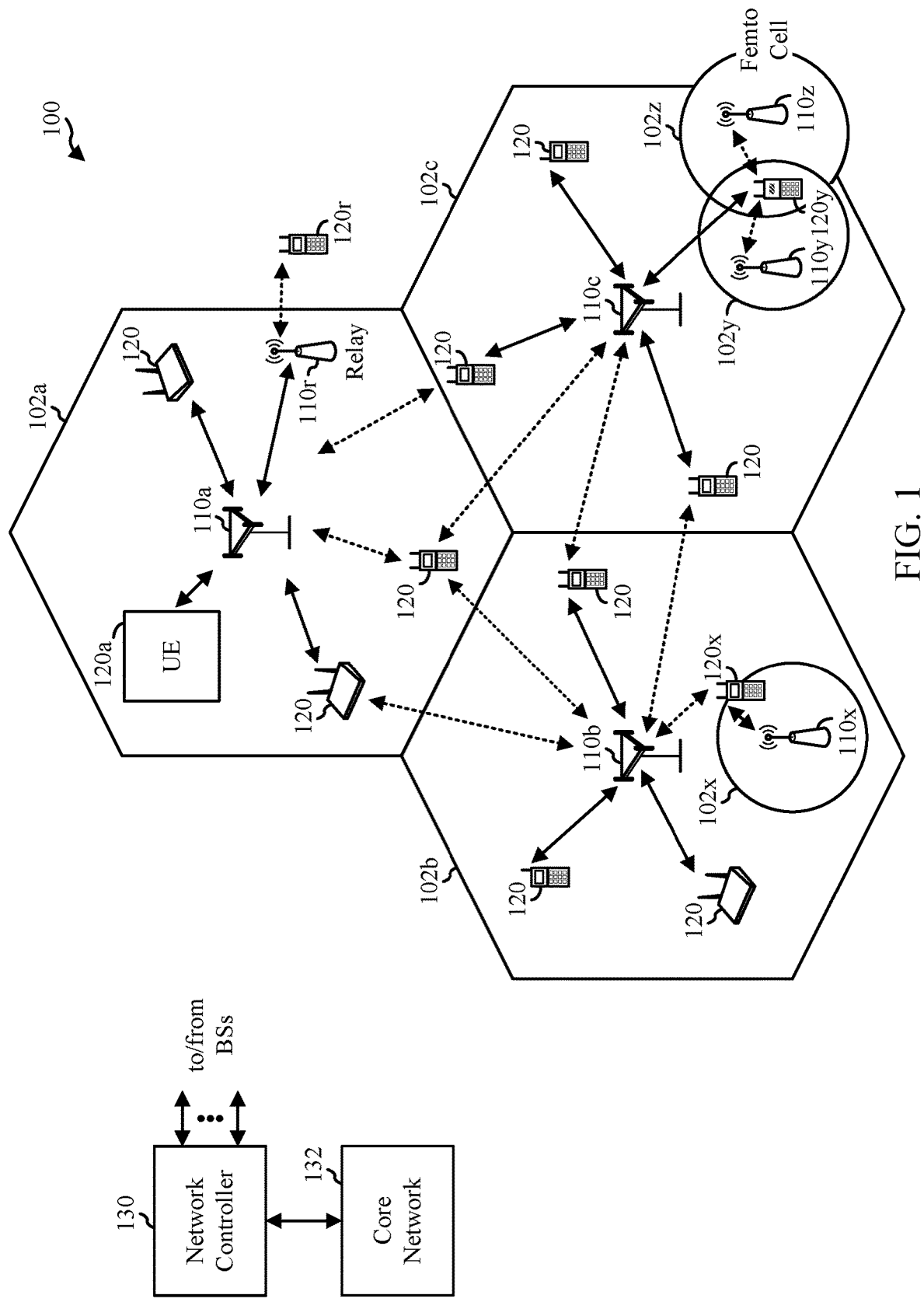
FIG. 1 is a diagram of an example wireless communications network, in which aspects of the present disclosure may be practiced.

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110a-z (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS 110. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110a, 110b, and 110c may be macro BSs for the macro cells 102a, 102b, and 102c, respectively. The BS 110x may be a pico BS for a pico cell 102x. The BSs 110y and 110z may be femto BSs for the femto cells 102y and 102z, respectively. ABS may support one or multiple cells.

The BSs 110 communicate with one or more user equipments (UEs) 120a-y (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120x, 120y, etc.) may be dispersed throughout the wireless communications network 100, and each UE 120 may be stationary or mobile. The wireless communications network 100 may also include relay stations (e.g., relay station 110r), also referred to as relays or the like, that receive a transmission of data and/or other information from an upstream station (e.g., a BS 110a or a UE 120r) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link)

is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number $N_{ap}$ of antennas to achieve transmit diversity for downlink transmissions and/or receive diversity for uplink transmissions. A set $N_u$ of UEs 120 may receive downlink transmissions and transmit uplink transmissions. Each UE 120 may transmit user-specific data to and/or receive user-specific data from the BSs 110. In general, each UE 120 may be equipped with one or multiple antennas. The $N_u$ UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include a digital-to-analog converter (DAC) with an adaptive calibration scheme, as described in more detail herein.

Figure 2:
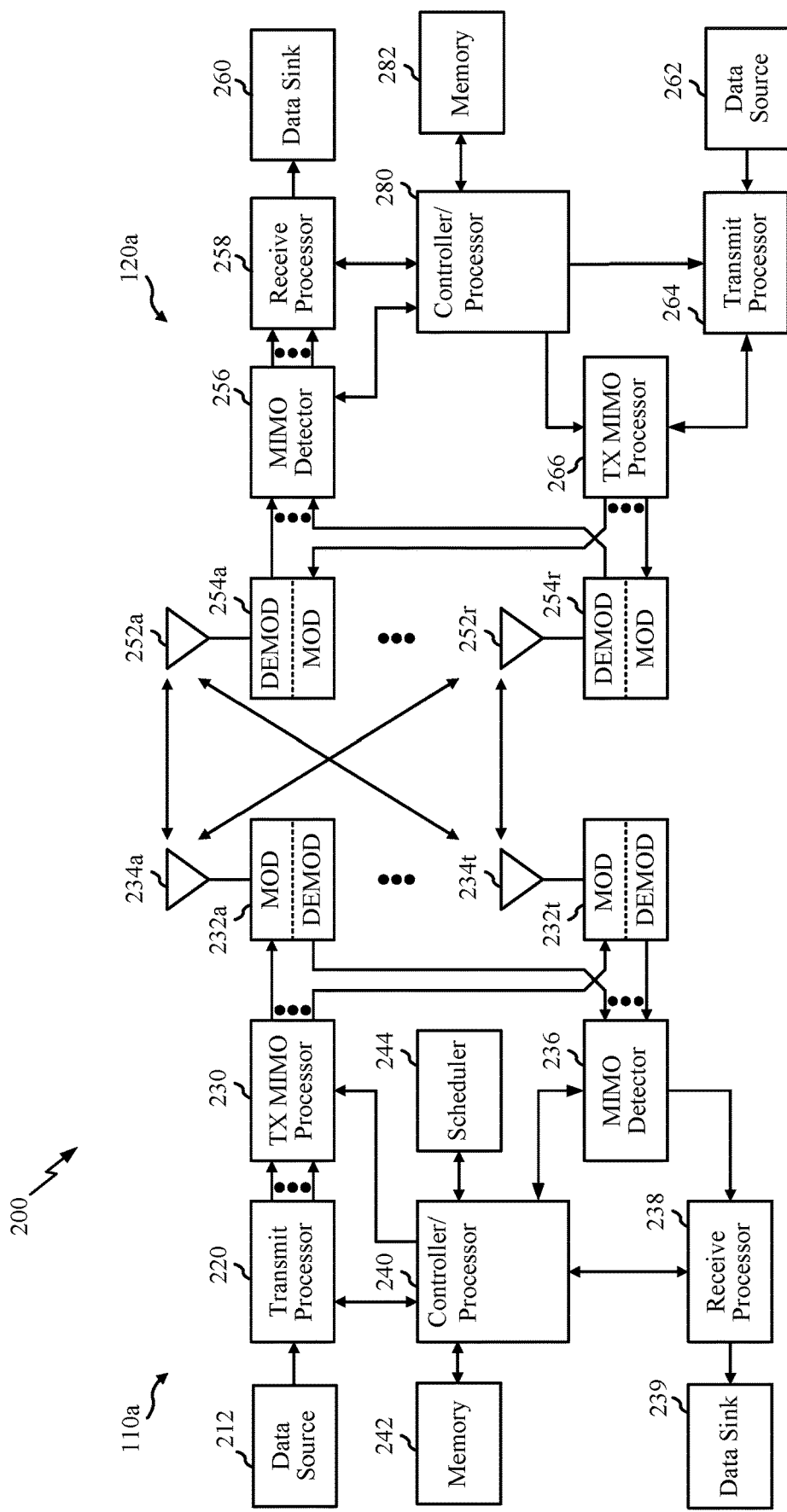
FIG. 2 is a block diagram conceptually illustrating a design of an example a base station (BS) and user equipment (UE), in which aspects of the present disclosure may be practiced.

FIG. 2 illustrates example components of BS 110*a* and UE 120*a* (e.g., from the wireless communications network 100 of FIG. 1), in which aspects of the present disclosure may be implemented.

On the downlink, at the BS 110*a*, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232*a*-232*t*. Each modulator in transceivers 232*a*-232*t* may process a respective output symbol stream (e.g., for orthogonal frequency division multiplexing (OFDM), etc.) to obtain an output sample stream. Each of the transceivers 232*a*-232*t* may further process (e.g., convert to analog, amplify, filter, and upconvert) the output sample stream to obtain a downlink signal. Downlink signals from the transceivers 232*a*-232*t* may be transmitted via the antennas 234*a*-234*t*, respectively.

At the UE 120*a*, the antennas 252*a*-252*r* may receive the downlink signals from the BS 110*a* and may provide received signals to the transceivers 254*a*-254*r*, respectively. The transceivers 254*a*-254*r* may condition (e.g., filter, amplify, downconvert, and digitize) a respective received signal to obtain input samples. Each demodulator (DEMOD) in the transceivers 232*a*-232*t* may further process the input samples (e.g., for OFDM, etc.) to obtain received symbols. A MIMO detector 256 may obtain received symbols from all the demodulators in transceivers 254*a*-254*r*, perform MIMO detection on the received symbols if applicable, and provide detected symbols. A receive processor 258 may process (e.g., demodulate, deinterleave, and decode) the detected symbols, provide decoded data for the UE 120*a* to a data sink 260, and provide decoded control information to a controller/processor 280.

On the uplink, at UE 120*a*, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254*a*-254*r* (e.g., for single-carrier frequency division multiplexing (SC-FDM), etc.), and transmitted to the BS 110*a*. At the BS 110*a*, the uplink signals from the UE 120*a* may be received by the antennas 234, processed by the demodulators in transceivers 232*a*-232*t*, detected by a MIMO detector 236 if applicable, and further processed by a receive processor 238 to obtain decoded data and control information sent by the UE 120*a*. The receive processor 238 may provide the decoded data to a data sink 239 and the decoded control information to the controller/processor 240.

The memories 242 and 282 may store data and program codes for BS 110*a* and UE 120*a*, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120*a* and/or antennas 234, processors 220, 230, 238, and/or controller/processor 240 of the BS 110*a* may be used to perform the various techniques and methods described herein.

In certain aspects of the present disclosure, the transceivers 232 and/or the transceivers 254 may include a digital-to-analog converter (DAC) with adaptive calibration circuitry, as described in more detail herein.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs).

Example RF Transceiver

Figure 3:
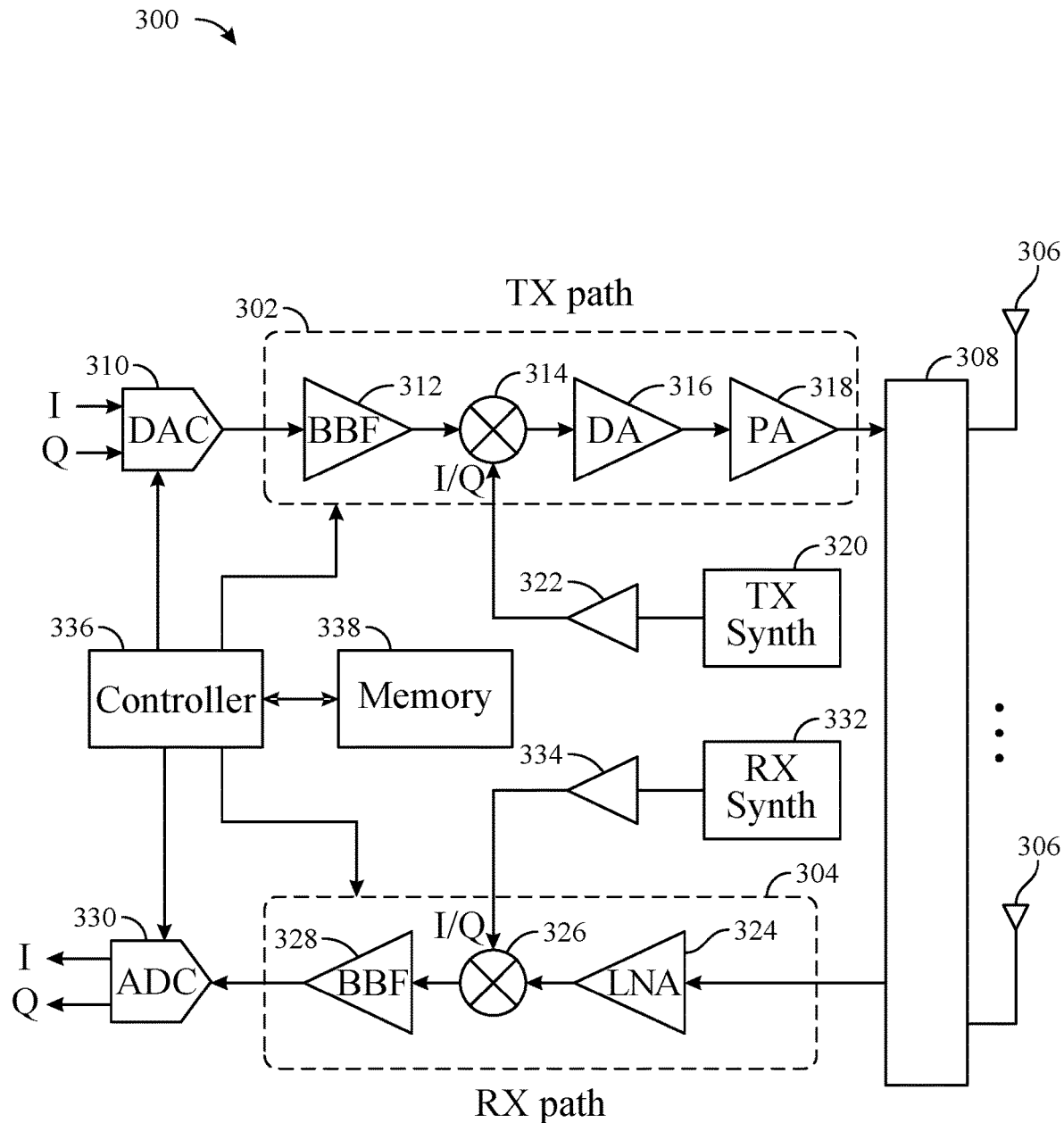
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

For certain aspects, the DAC 310 may be implemented by any of various suitable high-speed DAC topologies, such as a current-steering DAC. For certain aspects, the DAC 310 may be implemented with calibration circuitry for calibrating a power supply voltage (e.g., a reference potential) for a switch driver of the DAC 310, as described in more detail below.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for digital-to-analog conversion in any of various other suitable systems (e.g., an audio system or other electronic system).

Example DAC with Calibration Circuitry

Current-steering digital-to-analog converters (DACs) are one example architecture for high performance digital-to-analog conversion in many wireless transmitters. Current-steering DACs offer versatility of design, high-speed operation, and high performance. Although current-steering DACs are described as one example type of DAC in which aspects of the present disclosure may be implemented, it is to be understood that aspects of the present disclosure may be applied to other suitable types of DACs, as well.

Figure 4:
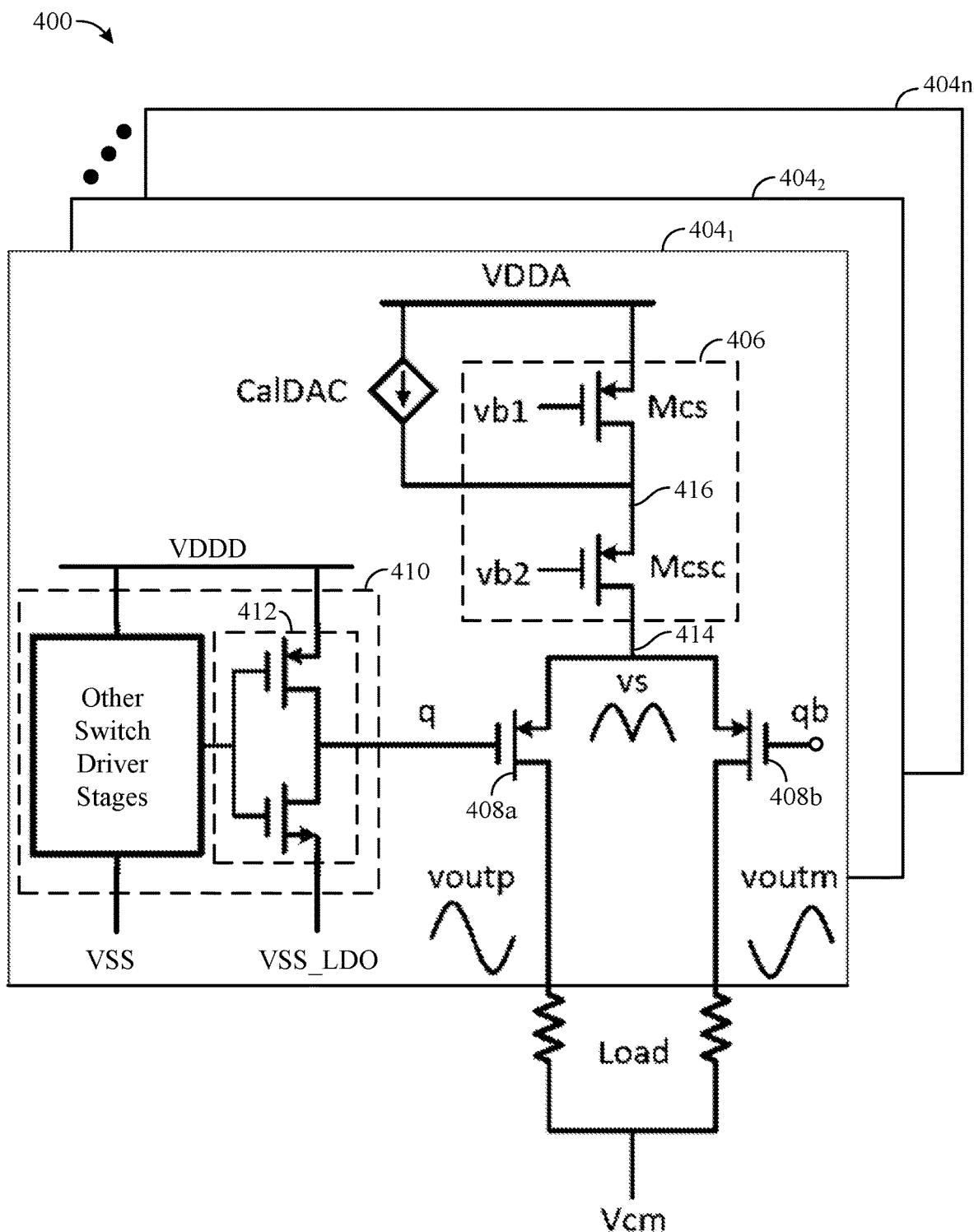
FIG. 4 is a schematic diagram of an example current-steering digital-to-analog converter (DAC), in which aspects of the present disclosure may be practiced.

FIG. 4 illustrates an example current-steering DAC 400 (e.g., which may implement the DAC 310 of FIG. 3). The core of the DAC 400 includes a number n of current-steering DAC cells $404_1$ through $404_n$ (collectively referred to as "current-steering DAC cells 404"), where n is an integer greater than one. Each DAC cell 404 may represent a different bit for the DAC 400 and, thus, at least some of the DAC cells may also be referred to as "most significant bit (MSB) units." Each DAC cell 404 may include a current source 406, a switch driver 410, and at least one current-steering switch 408a. In some aspects, the current-steering switch 408a may be part of a pair of differential current-steering switches. That is, each DAC cell may also optionally include a complementary current-steering switch 408b operated differentially with the current-steering switch 408a, as shown in FIG. 4. For ease of description, the current-steering switches 408a and 408b may be referred to collectively as "current-steering switches 408."

The switch driver 410 may receive power from a first power supply rail (labeled "VDDD" to indicate a digital-domain power supply rail), whereas the current source 406 and the switch(es) 408 may receive power from a second power supply rail (labeled "VDDA" to indicate an analog-domain power supply rail). The VDDA power supply rail may have a higher voltage than the VDDD power supply rail, in certain aspects. As shown, a controlled current source (labeled "CalDAC") may also be coupled between the second power supply rail and the current source 406 and may be used as a calibration DAC to adjust the current effectively supplied by the current source 406 via the current-steering switches 408.

The switch driver 410 may include a plurality of stages, including last stage 412, which may have a first power supply voltage (e.g., a reference potential labeled "VSS_LDO") different than a second power supply voltage (e.g., another reference potential labeled "VSS") for other stages of the switch driver 410. In some aspects, as shown in FIG. 4, the last stage 412 may be implemented as a complementary metal-oxide-semiconductor (CMOS) inverter. The switch driver 410 may generally be used to improve the dynamic performance of the current-steering DAC 400. For example, the switch driver 410 may be used to reduce the signal feedthrough, reduce current source node setting, reduce local and global timing errors, etc. The switch driver 410 may receive a digital input signal and a clock signal and generate one or more output signals (e.g., complementary output signals labeled "q" and "qb" as shown in FIG. 4) that drive the control input(s) of one or more of the current-steering switches 408 (e.g., the gates of transistors implementing the switches).

Depending on the digital input signal, each bit of the DAC 400 associated with a current-steering DAC cell 404 may control one or more of that respective cell's current-steering switches 408 to source or block a current from the cell's current source 406 to the output of the DAC cell 404. The sourced currents from the individual DAC cells 404 may be combined (e.g., using current summation) to provide the analog output signal at the DAC output. The DAC output may be coupled to a baseband filter (e.g., the BBF 312 of FIG. 3) or any of various other suitable circuits.

The current source 406 may be coupled in series with one or more of the current-steering switches 408 at a first node 414 (also referred to as the "common source node") with a common source voltage (labeled "vs"). The current source 406 may be a cascoded current source implemented by a first transistor Mcs and a second transistor Mcsc, the second transistor Mcsc having a source coupled to a drain of the first transistor Mcs at a second node 416. The first transistor Mcs and the second transistor Mcsc may be any type of suitable transistor, such as a p-type metal-oxide-semiconductor (PMOS) transistor as illustrated in FIG. 4. Each of the cascoded transistors may have a control input (e.g., gates of the transistors Mcs and Mcsc, which may receive control input signals (bias voltage signals labeled "vb1" and "vb2") that control the amount of current sourced by the current source 406.

One or more of the current-steering switches 408 may also be implemented by a transistor, such as a PMOS transistor as illustrated in FIG. 4. In that case, sources of the current-steering switches 408 may be coupled in series to the current source 406 (and more specifically to a drain of the transistor Mcsc). The current-steering switches 408 may also be coupled to a load having a source of common-mode voltage (labeled "Vcm"), as shown. Differential output signals (labeled "voutp" and "voutm") may be generated at the differential output nodes (e.g., at drains of the current-steering switches 408).

Non-idealities in a DAC may reduce the signal-to-noise-and-distortion ratio (SNDR) and distortion performance (e.g., spurious free dynamic range (SFDR)) of the DAC, and therefore may reduce the effective number of bits (ENOB) of the DAC. Consequently, such non-idealities may also reduce performance of a transmitter system in which the DAC is implemented. One example non-ideality is distortion at the common source node (the first node 414) of each DAC cell. During output switching of the current-steering switches 408 between the positive and negative outputs, the charge redistribution may create disturbance at the common source node. The disturbance at the common source node (e.g., Δvs) is signal dependent and may contribute significantly to the dynamic non-linearity of the DAC. The disturbance at the common source node from the output swing may be expressed as:

$$\Delta vs = \frac{1}{1 + g_m/g_{ds}} * \Delta voutp$$

where $g_m$ and $g_{ds}$ are the transconductances of the current-steering switches 408 and Δvoutp is the output swing. Accordingly, to reduce the disturbance at the common source node, the DAC 400 may be designed such that the ratio of $g_m$ to $g_{ds}$ is greater than 1 (and preferably as large as practicable, without affecting headroom of a DAC cell).

For some implementations, to reduce this disturbance, a voltage supplied to the last stage 412 of the switch driver 410 (e.g., VSS_LDO) is fixed to a particular value (e.g., 200 mV) to push the current-steering switches 408 into operating in the saturation region. However, increasing the voltage at VSS_LDO will reduce the headroom of the current source 406 (e.g., by reducing the drain-to-source voltage of the transistor Mcsc). Additionally, the operating region of the transistors (implementing the current-steering switches 408, for example) is highly dependent on changes in process, voltage, and temperature (PVT).

Certain aspects of the present disclosure provide techniques and circuitry for ensuring that the voltage of the common source node (or the drain-to-source voltage of the transistor Mcsc) is equal to (or at least approximately equal to), or less than, a preset direct-current (DC) voltage (e.g., a "reference voltage" or "calibration voltage"). The preset DC voltage may be selected to optimize (or at least improve) the tradeoff between the disturbance at the common source node and the headroom of the current source 406 across operation corners and PVT variations. Thus, certain aspects of the present disclosure provide techniques and circuitry for calibrating a power supply voltage for a switch driver in one or more DAC cells of a current-steering DAC (e.g., calibrating VSS_LDO for the last stage 412 in one or more of the switch drivers 410). The calibration may improve dynamic DAC performance across PVT changes in the DAC core, such as PVT of a DAC cell's current-steering switches 408. Additionally, the calibration may be performed once during factory calibration (e.g., without demanding additional or repeated calibration), and the calibration circuitry may contribute relatively little area and power consumption.

Figure 5A:
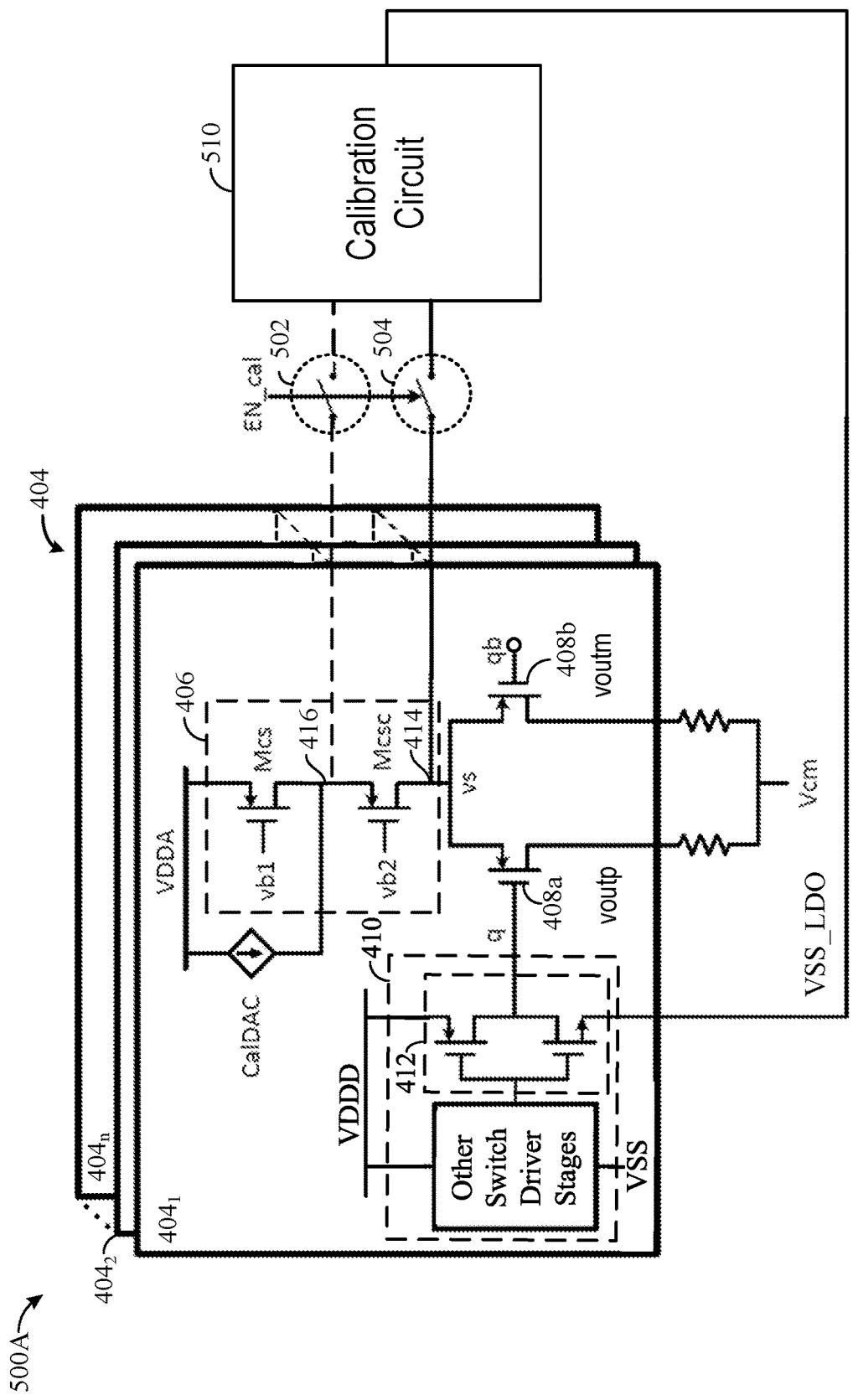
FIG. 5A illustrates an example current-steering DAC with calibration circuitry, in accordance with certain aspects of the present disclosure.

FIG. 5A illustrates an example DAC 500A, in accordance with aspects of the present disclosure. The DAC 500A may be similar to the DAC 400, but with the addition of calibration circuitry 510. As shown, the calibration circuitry 510 may have at least one input coupled to at least one DAC cell 404 in the plurality of DAC cells 404, and may have an output coupled to at least one of the plurality of DAC cells 404.

Specifically, the calibration circuitry 510 may have a first input coupled to a first node 414 located between the current source 406 (e.g., at a drain of the transistor Mcsc) and the current-steering switch 408 (e.g., at a source of the transistor implementing the current-steering switch 408) in a first DAC cell $404_1$. The calibration circuitry 510 may also have an output coupled to a power supply input for at least one stage (e.g., the last stage 412) of the switch driver 410 in one or more of the DAC cells (e.g., the first DAC cell $404_1$ or all the DAC cells 404). The calibration circuitry 510 may be configured to sense a voltage of the first node 414 in the first DAC cell $404_1$, and to control a power supply voltage for the switch driver 410 (e.g., VSS_LDO) in the at least one of the plurality of DAC cells 404 based on the voltage of the first node 414 in the first DAC cell $404_1$.

For example, the calibration circuitry 510 may be configured to compare the voltage at the first node 414 to a reference voltage and increase the power supply voltage for the switch driver 410 until the voltage of the first node 414 is greater than or equal to the reference voltage. The reference voltage may be selected to cover PVT variations and random mismatch of various components, such as the transistor Mcs, the transistor Mcsc, and non-idealities from the calibration circuitry 510.

As shown, the calibration circuitry 510 may optionally have a second input coupled to a second node 416 located between the cascoded transistors of the current source 406 (e.g., between a drain of the transistor Mcs and a source of the transistor Mcsc). In this case, the calibration circuitry 510 may be configured to sense the differential voltage between the first node 414 and the second node 416 in the first DAC cell $404_1$. The calibration circuitry 510 may be further configured to control the power supply voltage for the switch driver 410 in one or more of the DAC cells 404 based on a voltage difference between the voltage of the first node 414 and the voltage of the second node 416 in the first DAC cell $404_1$. The voltage difference between the voltage of the first node 414 and the voltage of the second node 416 may also be referred to as the drain-to-source voltage (Vds) of the transistor Mcsc.

In certain aspects, the calibration circuitry 510 may be configured to adjust the power supply voltage (e.g., VSS_LDO) for the switch driver 410 in response to determining that the voltage difference between the voltage of the first node 414 and the voltage of the second node 416 is greater than a reference voltage. The reference voltage may be set, for example, to a value that ensures the transistor Mcsc is operating in the saturation region across PVT variations. In certain aspects, the calibration circuitry 510 may be configured to iteratively compare the reference voltage and the voltage difference between the voltage of the first node 414 and the voltage of the second node 416, and increase the power supply voltage until the voltage difference between the voltage of the first node 414 and the voltage of the second node 416 is less than or equal to the reference voltage.

In some aspects, the calibration circuitry 510 may be coupled to all of the DAC cells 404. In this case, the calibration circuitry 510 may be configured to adjust the power supply voltage of the switch driver 410 in one or more of the DAC cells 404, based on sensed voltages from all DAC cells 404. For example, the power supply voltage for the switch driver 410 in each DAC cell 404 may be calibrated based on one or more sensed voltages from the respective DAC cell 404. While this implementation balances parasitic capacitances and prevents one or more outliers from hurting the performance of the DAC 500A (e.g., by considering Vds for and accounting for Vds mismatch between all DAC cells 404), the layout of the calibration circuitry 510 may be complex, and/or the calibration time may be increased significantly (e.g., if several DAC cells 404 in the DAC 500A are calibrated one at a time).

In other aspects, the calibration circuitry 510 may be coupled to a single DAC cell 404 (e.g., the first DAC cell $404_1$). In this case, the calibration circuitry 510 may be configured to adjust the power supply voltage of the switch driver 410 in one or more of the DAC cells 404, based on one or more sensed voltage(s) (e.g., a single or differential voltage) from the single DAC cell. While this implementation provides a compact layout and a short calibration time, mismatched parasitics and/or mismatched Vds between DAC cells 404 may cause degraded performance of the DAC 500A (e.g., if the sensed Vds of the single DAC cell is an outlier).

In yet another example aspect, the calibration circuitry 510 may be coupled to a select group of the DAC cells 404 (e.g., three DAC cells 404). In this case, the calibration circuitry 510 may be configured to adjust the power supply voltage of the switch driver 410 in one or more of the DAC cells 404, based on sensed voltages from the selected DAC cells 404. For example, the power supply voltage for the switch driver 410 in each DAC cell 404 may be calibrated based on one or more sensed voltages from the selected group of DAC cells 404. In some examples, each DAC cell 404 may be calibrated based on one or more voltages from the selected group of DAC cells 404 which is or are most similarly sized to the DAC cell 404 being calibrated. This implementation may provide a balance between the mismatch, accuracy, layout complexity, and calibration time discussed above with respect to the other example implementations.

In some aspects, the first and/or second input of the calibration circuitry 510 may optionally be coupled to the one or more DAC cells 404 via switches 502 and 504. The switches 502 and 504 may be implemented by transmission gates or any of other various suitable components, such as PMOS switches. Implementing the switches 502, 504 with smaller transistor size may introduce less parasitic capacitance to the transistor Mcsc and the common source node. According to certain aspects, the switches 502 and 504 may be configured to be in a closed state in response to receiving an indication (labeled "EN_cal") that the DAC 500A is in a calibration mode. In some aspects, the switches 502 and 504 may be considered part of the calibration circuitry 510. In other aspects, the switches 502 and 504 may be part of the DAC cells 404, such that one or more DAC cells may be selected for calibrating the power supply voltage, as described above. In such cases, the switches 502 and 504 may be replicated and appear in more than one DAC cell.

Figure 5B:
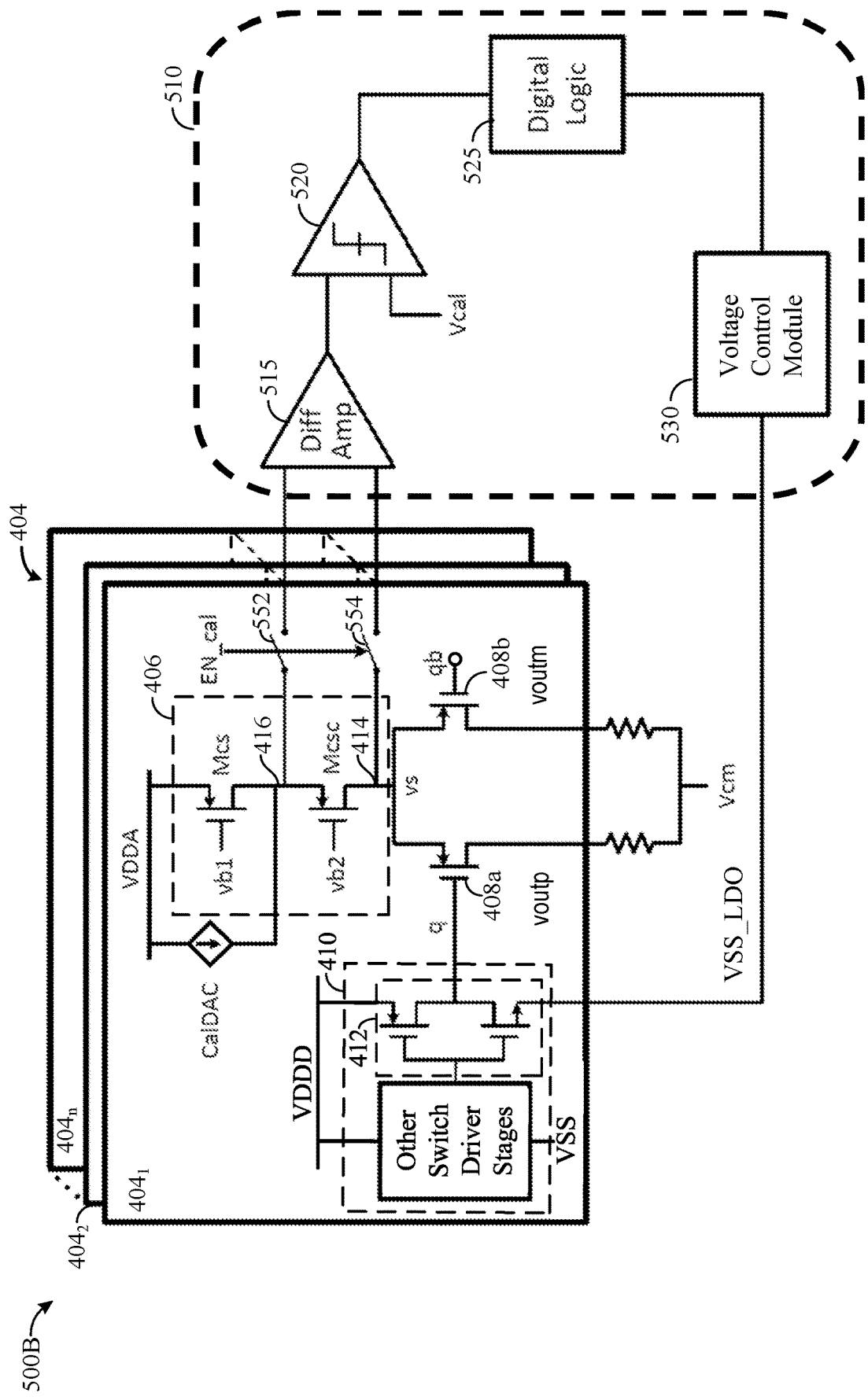
FIG. 5B illustrates example circuits for implementing the calibration circuitry of FIG. 5A, in accordance with certain aspects of the present disclosure.

FIG. 5B illustrates a DAC 500B with example circuits for implementing the calibration circuitry 510, in accordance with certain aspects of the present disclosure. As shown, the calibration circuitry 510 may generally include a differential amplifier 515, a comparator 520, digital logic 525, and a voltage control module 530.

The differential amplifier 515 may have a first input coupled to the first node 414 (e.g., at the drain of the transistor Mcsc) in the first DAC cell $404_1$ and may have a second input coupled to the second node 416 (e.g., at the source of the transistor Mcsc) in the first DAC cell $404_1$. The differential amplifier 515 may be configured to output a voltage difference between the voltage of the first node 414 and the voltage of the second node 416.

The comparator 520 may have a first input coupled to an output of the differential amplifier 515, and may have a second input coupled to a reference voltage source configured to output a reference voltage (labeled "Vcal"). The comparator 520 may be configured to compare the voltage difference between the voltage of the first node 414 and the voltage of the second node 416 (as output by the differential amplifier 515) to the reference voltage, and output an indication of the result of the comparison. For example, the comparator 520 may be configured to output a logic "0" if the voltage difference between the voltage of the first node 414 and the voltage of the second node 416 is less than or equal to the reference voltage. The comparator may also be configured to output a logic "1" if the voltage difference between the voltage of the first node 414 and the voltage of the second node 416 is greater than the reference voltage.

The digital logic 525 may have an input coupled to an output of the comparator 520, and may have an output coupled to an input of the voltage control module 530. The digital logic 525 may be configured to output, based on the output of the comparator 520, a digital signal representing the voltage to be output by the voltage control module 530. If more than one DAC cells are sensed, the digital logic 525 may have a corresponding number of memories to store the calibration results for each sensed DAC cell. In this case, the digital logic 525 may be configured to process (e.g., average) the stored results to output a single voltage output to the voltage control module 530. The voltage control module 530 may be configured to convert the digital signal at the output of the digital logic 525 into the power supply voltage for the switch driver 410. In some aspects, the voltage control module 530 may be implemented by a DAC, such as a ground low-dropout (ground LDO, or GND LDO) DAC or a voltage regulator (an LDO regulator). In other aspects, the voltage control module 530 may be implemented by a lookup table, such that the output of the digital logic 525 corresponds to a voltage in the lookup table, which the voltage control module 530 may then output.

Continuing from the example above, if the comparator 520 outputs a logic "1" then the digital logic 525 may be configured to output a digital signal representing a voltage greater than the voltage being generated by the voltage control module 530. In other words, in response to the determination (by the comparator 520) that the voltage difference between the voltage of the first node 414 and the voltage of the second node 416 is greater than the reference voltage, the digital logic 525 may indicate for the voltage control module 530 to increase the power supply voltage for the switch driver 410 (e.g., VSS_LDO). This increase may be according to a predefined step size (e.g., 50 mV), each iteration through the calibration loop. For certain aspects, the starting point of the power supply voltage for the first iteration may be the minimum value (e.g., VSS_LDO=0 V).

Once the voltage control module 530 has increased the power supply voltage, the process described above may be repeated in an iterative fashion until the comparator 520 outputs a logic "0" indicating that the voltage difference between the voltage of the first node 414 and the voltage of the second node 416 is less than or equal to the reference voltage. If a single DAC cell is selected to be calibrated, the digital logic 525 may be configured to indicate for the voltage control module 530 to continue generating (e.g., maintain) the current power supply voltage.

If multiple DAC cells are selected to be calibrated, the digital logic 525 may be configured to store the results of each DAC cell calibration (e.g., codes indicative of a value of VSS_LDO) in memory, and repeat the process in each of the selected DAC cells until all selected DAC cells are calibrated. The digital logic 525 may be further configured to process (e.g., average) the stored codes to generate one output code to output to the voltage control module 530. The voltage control module 530 may then use the output code to generate the power supply voltage indicated by the output code while the DAC 500B operates in mission mode.

As shown, each DAC cell 404 may optionally include a first switch 552 and a second switch 554. That is, the first and/or second input of the calibration circuitry 510 may optionally be coupled to the one or more DAC cells 404 via switches 552 and 554. The switches 552 and 554 may be implemented as transmission gates, as described above. According to certain aspects, the switches 552 and 554 may be configured to be in a closed state in response to receiving an indication (labeled "EN_cal") that the DAC 500B is in a calibration mode.

According to certain aspects, the calibration circuitry 510 may be coupled to more than one DAC cell 404. That is, the first input of the calibration circuitry 510 may be selectively coupled (e.g., via switches 552 and/or 554) to the first DAC cell $404_1$ and selectively coupled to a second DAC cell (e.g., a second DAC cell $404_2$) in the plurality of DAC cells 404. In this case, the calibration circuitry 510 may be configured to sense a voltage of the first node 414 in the second DAC cell $404_2$ (in addition or as an alternative to sensing the voltage of the first node 414 in the first DAC cell $404_1$) and to control the power supply voltage for the switch driver 410 in one or more of the DAC cells 404 based on the voltage of the first node 414 in the first DAC cell $404_1$ and/or on the voltage of the first node 414 in the second DAC cell $404_2$.

For ease of description, the above examples refer to DAC cell $404_1$ as "the first DAC cell $404_1$," and to DAC cell $404_2$ as "the second DAC cell $404_2$." However, one skilled in the relevant art will understand that any one of the DAC cells 404 may be considered the "first DAC cell," and any one of the DAC cells 404 may be considered the "second DAC cell." That is, in other examples, inputs of the calibration circuitry 510 may be coupled to a first node 414 and/or a second node 416 in any one or more of the DAC cells 404, not only the DAC cell $404_1$ and/or the DAC cell $404_2$.

Aspects of the present disclosure with calibration circuitry for a power supply voltage of a switch driver offer increased signal-to-noise-and-distortion ratio (SNDR) and lower distortion over operation corners compared to some other DAC switch biasing solutions. Aspects of the present disclosure may also offer reduced switching noise, smaller area, lower supply voltage, lower quiescent current, and/or lower peak load current compared to some other DAC switch biasing schemes.

Example Conversion Operations

Figure 6:
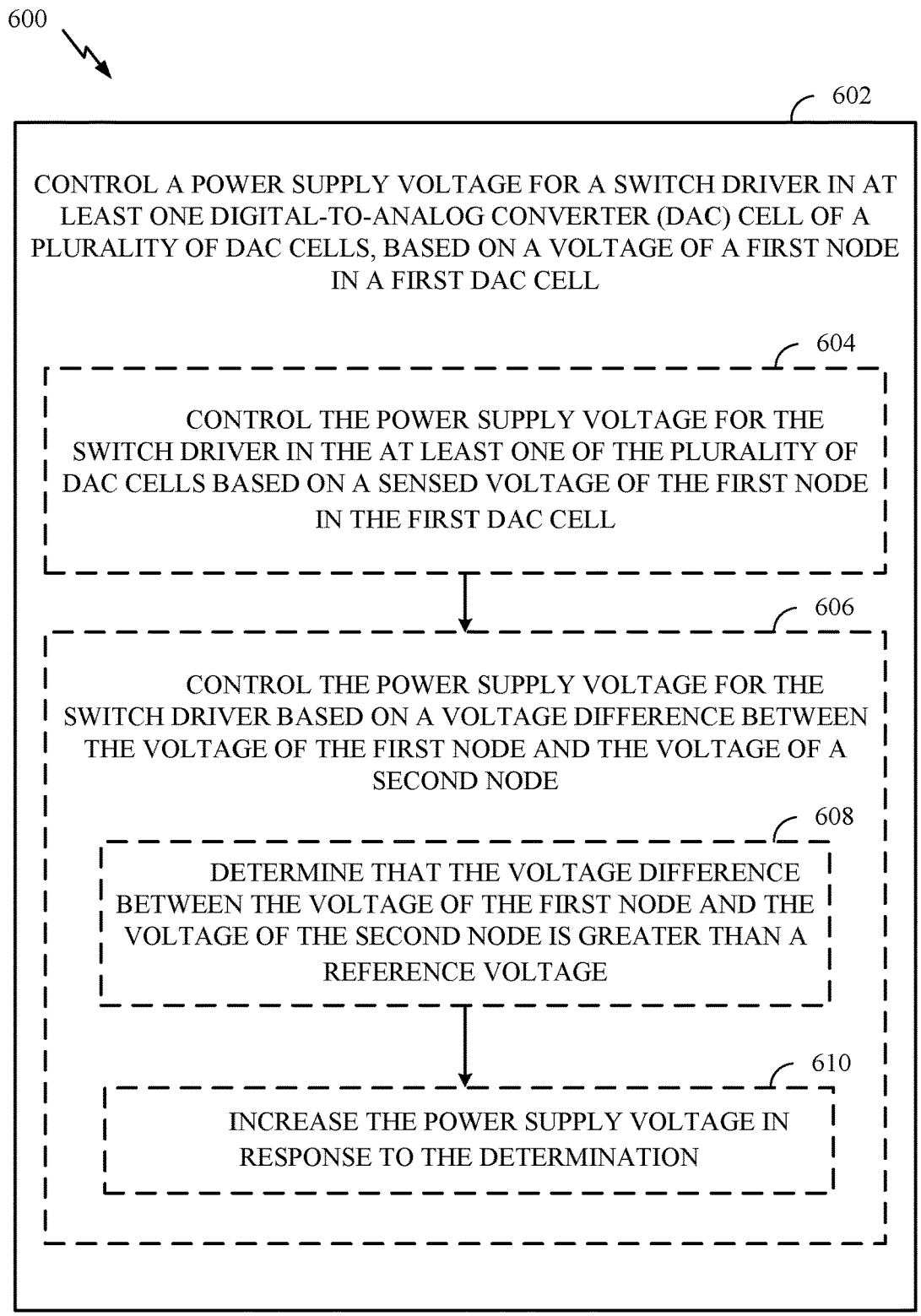
FIG. 6 is a flow diagram of example operations for operating a DAC, in accordance with certain aspects of the present disclosure.

FIG. 6 is a flow diagram of example operations 600 for operating a DAC (e.g., the DAC 500A or 500B), in accordance with certain aspects of the present disclosure. The DAC generally includes a plurality of DAC cells (e.g., the DAC cells 404), and each DAC cell may include a current source (e.g., the current source 406), a first switch (e.g., a current-steering switch 408a or 408b) coupled in series with the current source at a first node (e.g., the first node 414), and a switch driver (e.g., the switch driver 410) having an output coupled to a control input (e.g., a gate) of the first switch. The operations 600 may be performed, for example, by a DAC with calibration circuitry as described above (e.g., DAC 500A or DAC 500B with calibration circuitry 510).

The operations 600 may generally involve, at block 602, controlling a power supply voltage (e.g., a reference potential, such as VSS_LDO) for the switch driver in at least one of the plurality of DAC cells, based on a voltage (e.g., common source voltage vs) of the first node in a first DAC cell (e.g., the first DAC cell $404_1$). The first DAC cell need not be a most significant bit (MSB) cell (i.e., the first DAC cell can be any of the DAC cells).

According to certain aspects, the operations 600 may involve sensing the voltage of the first node in the first DAC cell. In this case, the controlling may involve, at block 604, controlling the power supply voltage for the switch driver in the at least one of the plurality of DAC cells based on the sensed voltage of the first node in the first DAC cell. In certain aspects, the controlling may involve providing the power supply voltage to a last stage (e.g., the last stage 412) of the switch driver in the at least one of the plurality of DAC cells.

According to certain aspects, the current source may be a cascoded current source comprising a first transistor (e.g., the transistor Mcs) and a second transistor (e.g., the transistor Mcsc). The second transistor may have a source coupled to a drain of the first transistor at a second node (e.g., the second node 416). In some aspects, the operations 600 may further involve sensing the voltage of the second node in the first DAC cell. In this case, the controlling may involve, at block 606, controlling the power supply voltage for the switch driver based on a voltage difference (e.g., Vds) between the voltage of the first node and the voltage of the second node. For certain aspects, the controlling may further involve, at block 608, determining that the voltage difference between the voltage of the first node and the voltage of the second node is greater than a reference voltage (e.g., Vcal) and, at block 610, increasing the power supply voltage in response to the determination.

According to certain aspects, the operations 600 may involve iteratively comparing a reference voltage and the voltage difference between the voltage of the first node and the voltage of the second node. In this case, the operations 600 may further involve increasing the power supply voltage until the voltage difference between the voltage of the first node and the voltage of the second node is less than or equal to the reference voltage.

According to certain aspects, the operations 600 may involve amplifying the voltage difference between the first node and the second node with a differential amplifier (e.g., the differential amplifier 515). In this case, the operations 600 may further involve comparing (e.g., via the comparator 520) the amplified voltage difference and a reference voltage (e.g., Vcal), and outputting (e.g., via the digital logic 525) a digital logic signal based on the comparison. In this case, the controlling may involve controlling the power supply voltage for the switch driver based on the digital logic signal.

According to certain aspects, sensing the voltage at the first node may involve closing a second switch (e.g., the switch 504 or the switch 554) coupled between the first node in the first DAC cell and a first input of the differential amplifier, and sensing the voltage at the second node may involve closing a third switch (e.g., the switch 502 or the switch 552) coupled between the second node in the first DAC cell and a second input of the differential amplifier.

According to certain aspects, the operations 600 may involve sensing a voltage of the first node in a second DAC cell (e.g., DAC cell $404_2$). In this case, the controlling at block 602 may involve controlling the power supply voltage for the switch driver in the at least one of the plurality of DAC cells based on the sensed voltage of the first node in the first DAC cell and on the sensed voltage of the first node in the second DAC cell. The current source in the second DAC cell may be a cascoded current source comprising a first transistor and a second transistor, and the second transistor may have a source coupled to a drain of the first transistor at a second node. In this case, the operations 600 may further involve sensing a voltage of the second node in the first DAC cell and sensing a voltage of the second node in the second DAC cell. In this case, the controlling may involve controlling the power supply voltage for the switch driver based on a first voltage difference between the voltage of the first node in the first DAC cell and the voltage of the second node in the first DAC cell and based on a second voltage difference between the voltage of the first node in the second DAC cell and the voltage of the second node in the second DAC cell.

Example Aspects

In addition to the various aspects described above, specific combinations of aspects are within the scope of the present disclosure, some of which are detailed below:

Aspect 1: A digital-to-analog converter (DAC) comprising: a plurality of DAC cells, each DAC cell comprising a current source, a first switch coupled in series with the current source at a first node, and a switch driver having an output coupled to a control input of the first switch; and calibration circuitry having a first input coupled to a first DAC cell in the plurality of DAC cells and having an output coupled to at least one of the plurality of DAC cells, the calibration circuitry being configured to sense a voltage of the first node in the first DAC cell and to control a power supply voltage for the switch driver in the at least one of the plurality of DAC cells, based on the voltage of the first node in the first DAC cell.

Aspect 2: The DAC of Aspect 1, wherein: the current source is a cascoded current source comprising a first transistor and a second transistor, the second transistor having a source coupled to a drain of the first transistor at a second node; the calibration circuitry has a second input coupled to the first DAC cell in the plurality of DAC cells; the calibration circuitry is further configured to sense a voltage of the second node in the first DAC cell; and the calibration circuitry is configured to control the power supply voltage for the switch driver based on a voltage difference between the voltage of the first node and the voltage of the second node.

Aspect 3: The DAC of Aspect 2, wherein the calibration circuitry comprises a differential amplifier having a first input coupled to the first node in the first DAC cell and having a second input coupled to the second node in the first DAC cell.

Aspect 4: The DAC of Aspect 3, wherein the calibration circuitry further comprises a second switch coupled between the first node in the first DAC cell and the first input of the differential amplifier and a third switch coupled between the second node in the first DAC cell and the second input of the differential amplifier.

Aspect 5: The DAC of Aspect 4, wherein the second switch and the third switch comprise transmission gates.

Aspect 6: The DAC of Aspect 4 or 5, wherein the second switch and the third switch are configured to be in a closed state in response to receiving an indication that the DAC is in a calibration mode.

Aspect 7: The DAC of any of Aspects 3 to 6, wherein the calibration circuitry further comprises: a comparator having a first input coupled to an output of the differential amplifier and having a second input coupled to a reference voltage source; and logic having an input coupled to an output of the comparator.

Aspect 8: The DAC of Aspect 7, further comprising a voltage control module having an input coupled to an output of the logic, the voltage control module being configured to convert a signal at the output of the logic into the power supply voltage for the switch driver.

Aspect 9: The DAC of Aspect 8, wherein the voltage control module comprises another digital-to-analog converter (DAC).

Aspect 10: The DAC of any of Aspects 2 to 9, wherein the calibration circuitry is configured to increase the power supply voltage in response to determining that the voltage difference between the voltage of the first node and the voltage of the second node is greater than a reference voltage.

Aspect 11: The DAC of Aspect 10, wherein the calibration circuitry is configured to: iteratively compare the reference voltage and the voltage difference between the voltage of the first node and the voltage of the second node; and increase the power supply voltage until the voltage difference between the voltage of the first node and the voltage of the second node is less than or equal to the reference voltage.

Aspect 12: The DAC of Aspect 10 or 11, wherein the reference voltage is selected based on characteristics, including voltage and temperature variations, of at least one of: the first transistor; the second transistor; or the calibration circuitry.

Aspect 13: The DAC of any of the preceding Aspects, wherein the power supply voltage is provided to a last stage of the switch driver in the at least one of the plurality of DAC cells.

Aspect 14: The DAC of Aspect 1, wherein: the first input of the calibration circuitry is selectively coupled to the first DAC cell and selectively coupled to a second DAC cell in the plurality of DAC cells; the calibration circuitry is further configured to sense a voltage of the first node in the second DAC cell; and the calibration circuitry is configured to control the power supply voltage for the switch driver based on the voltage of the first node in the first DAC cell and on the voltage of the first node in the second DAC cell.

Aspect 15: The DAC of Aspect 14, wherein: the current source is a cascoded current source comprising a first transistor and a second transistor, the second transistor having a source coupled to a drain of the first transistor at a second node; the calibration circuitry has a second input selectively coupled to the first DAC cell and selectively coupled to the second DAC cell; the calibration circuitry is further configured to sense a voltage of the second node in the first DAC cell and a voltage of the second node in the second DAC cell; and the calibration circuitry is configured to control the power supply voltage for the switch driver based on a first voltage difference between the voltage of the first node in the first DAC cell and the voltage of the second node in the first DAC cell and on a second voltage difference between the voltage of the first node in the second DAC cell and the voltage of the second node in the second DAC cell.

Aspect 16: The DAC of Aspect 15, wherein: the calibration circuitry comprises a differential amplifier having a first input selectively coupled to the first node in the first DAC cell and selectively coupled to the first node in the second DAC cell and having a second input selectively coupled to the second node in the first DAC cell and selectively coupled to the second node in the second DAC cell; the first DAC cell further comprises a second switch coupled between the first node in the first DAC cell and the first input of the differential amplifier and a third switch coupled between the second node in the first DAC cell and the second input of the differential amplifier; and the second DAC cell further comprises a fourth switch coupled between the first node in the second DAC cell and the first input of the differential amplifier and a fifth switch coupled between the second node in the second DAC cell and the second input of the differential amplifier.

Aspect 17: A wireless device comprising the DAC of any of the preceding Aspects, the wireless device further comprising: one or more antennas; and one or more transmit paths coupled between one or more outputs of the DAC and the one or more antennas.

Aspect 18: A method for operating a digital-to-analog converter (DAC) comprising a plurality of DAC cells, each DAC cell comprising a current source, a first switch coupled in series with the current source at a first node, and a switch driver having an output coupled to a control input of the first switch, the method comprising controlling a power supply voltage for the switch driver in at least one of the plurality of DAC cells, based on a voltage of the first node in a first DAC cell.

Aspect 19: The method of Aspect 18, further comprising sensing the voltage of the first node in the first DAC cell, wherein the controlling comprises controlling the power supply voltage for the switch driver in the at least one of the plurality of DAC cells based on the sensed voltage of the first node in the first DAC cell.

Aspect 20: The method of Aspect 18 or 19, wherein: the current source is a cascoded current source comprising a first transistor and a second transistor, the second transistor having a source coupled to a drain of the first transistor at a second node; the method further comprises sensing a voltage of the second node in the first DAC cell; and the controlling comprises controlling the power supply voltage for the switch driver based on a voltage difference between the voltage of the first node and the voltage of the second node.

Aspect 21: The method of Aspect 20, further comprising: determining that the voltage difference between the voltage of the first node and the voltage of the second node is greater than a reference voltage; and increasing the power supply voltage in response to the determination.

Aspect 22: The method of Aspect 20, further comprising: iteratively comparing a reference voltage and the voltage difference between the voltage of the first node and the voltage of the second node; and increasing the power supply voltage until the voltage difference between the voltage of the first node and the voltage of the second node is less than or equal to the reference voltage.

Aspect 23: The method of any of Aspects 20 to 22, further comprising amplifying the voltage difference between the first node and the second node with a differential amplifier.

Aspect 24: The method of Aspect 23, wherein the sensing comprises: closing a second switch coupled between the first node in the first DAC cell and a first input of the differential amplifier; and closing a third switch coupled between the second node in the first DAC cell and a second input of the differential amplifier.

Aspect 25: The method of Aspect 23 or 24, further comprising: comparing the amplified voltage difference and a reference voltage; and outputting a digital logic signal based on the comparison, wherein the controlling comprises controlling the power supply voltage for the switch driver based on the digital logic signal.

Aspect 26: The method of Aspect 19, further comprising sensing a voltage of the first node in a second DAC cell, wherein the controlling comprises controlling the power supply voltage for the switch driver in the at least one of the plurality of DAC cells based on the sensed voltage of the first node in the first DAC cell and on the sensed voltage of the first node in the second DAC cell.

Aspect 27: The method of Aspect 26, wherein: the current source is a cascoded current source comprising a first transistor and a second transistor, the second transistor having a source coupled to a drain of the first transistor at a second node; the method further comprises sensing a voltage of the second node in the first DAC cell and a voltage of the second node in the second DAC cell; and the controlling comprises controlling the power supply voltage for the switch driver based on a first voltage difference between the voltage of the first node in the first DAC cell and the voltage of the second node in the first DAC cell and on a second voltage difference between the voltage of the first node in the second DAC cell and the voltage of the second node in the second DAC cell.

Aspect 28: The method of any of Aspects 18 to 27, wherein the controlling comprises providing the power supply voltage to a last stage of the switch driver in the at least one of the plurality of DAC cells.

Aspect 29: An apparatus for digital-to-analog conversion, comprising: a plurality of digital-to-analog converter (DAC) cells, each DAC cell comprising means for sourcing current, means for switching coupled in series with the means for sourcing current at a node, and means for driving the means for switching; and means for controlling a power supply voltage for the means for driving the means for switching in at least one of the plurality of DAC cells, based on a voltage of the node in a first DAC cell.

Aspect 30: The apparatus of Aspect 29, further comprising means for sensing the voltage of the node in the first DAC cell, wherein the means for controlling is configured to control the power supply voltage for the means for driving the means for switching in the at least one of the plurality of DAC cells, based on the sensed voltage of the node in the first DAC cell.

CONCLUSION

Described herein is a digital-to-analog converter (DAC) circuit design to reduce distortion in the DAC over operation corners, without significantly increasing area or power consumption of the DAC. Certain aspects of the present disclosure provide calibration circuitry for a current-steering DAC that calibrates the power supply voltage (e.g., a reference potential) provided to the last (inverter) stage of switch drivers in the DAC. To calibrate the power supply voltage, the calibration circuitry compares sensed voltage(s) at one or more nodes of at least one DAC cell to a reference voltage, and increases the power supply voltage until the sensed voltage (or a voltage difference between sensed voltages) is greater than the reference voltage.

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components. For example, means for sourcing current may include a current source, such as the current source 406 of FIG. 4, 5A or 5B. Means for switching may include one or more switches, such as the switches 408 of FIG. 4, 5A, or 5B. Means for driving the means for switching may include a switch driver, such as the switch driver 410 of FIG. 4, 5A, or 5B. Means for controlling a power supply voltage (e.g., a reference potential) for the means for driving, and means for sensing the voltage of a node, may include calibration circuitry, such as the calibration circuitry 510 of FIG. 5A or 5B.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A digital-to-analog converter (DAC) comprising:
a plurality of DAC cells, each DAC cell comprising a current source, a first switch coupled in series with the current source at a first node, and a switch driver having an output coupled to a control input of the first switch, wherein the current source is a cascoded current source comprising a first transistor and a second transistor, the second transistor having a source coupled to a drain of the first transistor at a second node; and
calibration circuitry having a first input coupled to a first DAC cell in the plurality of DAC cells, having a second input coupled to the first DAC cell in the plurality of DAC cells, and having an output coupled to at least one of the plurality of DAC cells, the calibration circuity being configured to:
sense a voltage of the first node in the first DAC cell;
sense a voltage of the second node in the first DAC cell; and
control a power supply voltage for the switch driver in the at least one of the plurality of DAC cells, based on a voltage difference between the voltage of the first node and the voltage of the second node.

2. The DAC of claim 1, wherein the calibration circuitry comprises a differential amplifier having a first input coupled to the first node in the first DAC cell and having a second input coupled to the second node in the first DAC cell.

3. The DAC of claim 2, wherein the calibration circuitry further comprises a second switch coupled between the first node in the first DAC cell and the first input of the differential amplifier and a third switch coupled between the second node in the first DAC cell and the second input of the differential amplifier.

4. The DAC of claim 3, wherein the second switch and the third switch comprise transmission gates.

5. The DAC of claim 3, wherein the second switch and the third switch are configured to be in a closed state in response to receiving an indication that the DAC is in a calibration mode.

6. The DAC of claim 2, wherein the calibration circuitry further comprises:
a comparator having a first input coupled to an output of the differential amplifier and having a second input coupled to a reference voltage source; and
logic having an input coupled to an output of the comparator.

7. The DAC of claim 6, further comprising a voltage control module having an input coupled to an output of the logic, the voltage control module being configured to convert a signal at the output of the logic into the power supply voltage for the switch driver.

8. The DAC of claim 7, wherein the voltage control module comprises another digital-to-analog converter (DAC).

9. The DAC of claim 1, wherein the calibration circuitry is configured to increase the power supply voltage in response to determining that the voltage difference between the voltage of the first node and the voltage of the second node is greater than a reference voltage.

10. The DAC of claim 9, wherein the calibration circuitry is configured to:

iteratively compare the reference voltage and the voltage difference between the voltage of the first node and the voltage of the second node; and
increase the power supply voltage until the voltage difference between the voltage of the first node and the voltage of the second node is less than or equal to the reference voltage.

11. The DAC of claim 9, wherein the reference voltage is selected based on characteristics, including voltage and temperature variations, of at least one of:
the first transistor;
the second transistor; or
the calibration circuitry.

12. The DAC of claim 1, wherein the power supply voltage is provided to a last stage of the switch driver in the at least one of the plurality of DAC cells.

13. A digital-to-analog converter (DAC) comprising:
a plurality of DAC cells, each DAC cell comprising a current source, a first switch coupled in series with the current source at a first node, and a switch driver having an output coupled to a control input of the first switch, wherein the current source is a cascoded current source comprising a first transistor and a second transistor, the second transistor having a source coupled to a drain of the first transistor at a second node; and
calibration circuitry having a first input selectively coupled to a first DAC cell in the plurality of DAC cells and selectively coupled to a second DAC cell in the plurality of DAC cells, having a second input selectively coupled to the first DAC cell and selectively coupled to the second DAC cell, and having an output coupled to at least one of the plurality of DAC cells, the calibration circuity being configured to:
sense a voltage of the first node in the first DAC cell;
sense a voltage of the first node in the second DAC cell;
sense a voltage of the second node in the first DAC cell;
sense a voltage of the second node in the second DAC cell; and
control the power supply voltage for the switch driver in the at least one of the plurality of DAC cells, based on a first voltage difference between the voltage of the first node in the first DAC cell and the voltage of the second node in the first DAC cell and on a second voltage difference between the voltage of the first node in the second DAC cell and the voltage of the second node in the second DAC cell.

14. The DAC of claim 13, wherein:
the calibration circuitry comprises a differential amplifier having a first input selectively coupled to the first node in the first DAC cell and selectively coupled to the first node in the second DAC cell and having a second input selectively coupled to the second node in the first DAC cell and selectively coupled to the second node in the second DAC cell;
the first DAC cell further comprises a second switch coupled between the first node in the first DAC cell and the first input of the differential amplifier and a third switch coupled between the second node in the first DAC cell and the second input of the differential amplifier; and
the second DAC cell further comprises a fourth switch coupled between the first node in the second DAC cell and the first input of the differential amplifier and a fifth switch coupled between the second node in the second DAC cell and the second input of the differential amplifier.

15. A wireless device comprising the DAC of claim 1, the wireless device further comprising:
one or more antennas; and
one or more transmit paths coupled between one or more outputs of the DAC and the one or more antennas.

16. A method for operating a digital-to-analog converter (DAC) comprising a plurality of DAC cells, each DAC cell comprising a current source, a first switch coupled in series with the current source at a first node, and a switch driver having an output coupled to a control input of the first switch, wherein the current source is a cascoded current source comprising a first transistor and a second transistor, the second transistor having a source coupled to a drain of the first transistor at a second node, the method comprising:
sensing a voltage of the first node in a first DAC cell;
sensing a voltage of the second node in the first DAC cell; and
controlling a power supply voltage for the switch driver in at least one of the plurality of DAC cells, based on a voltage difference between the voltage of the first node and the voltage of the second node.

17. The method of claim 16, further comprising:
determining that the voltage difference between the voltage of the first node and the voltage of the second node is greater than a reference voltage; and
increasing the power supply voltage in response to the determination.

18. The method of claim 16, further comprising:
iteratively comparing a reference voltage and the voltage difference between the voltage of the first node and the voltage of the second node; and
increasing the power supply voltage until the voltage difference between the voltage of the first node and the voltage of the second node is less than or equal to the reference voltage.

19. The method of claim 16, further comprising amplifying the voltage difference between the first node and the second node with a differential amplifier.

20. The method of claim 19, wherein the sensing comprises:
closing a second switch coupled between the first node in the first DAC cell and a first input of the differential amplifier; and
closing a third switch coupled between the second node in the first DAC cell and a second input of the differential amplifier.

21. The method of claim 19, further comprising:
comparing the amplified voltage difference and a reference voltage; and
outputting a digital logic signal based on the comparison, wherein the controlling comprises controlling the power supply voltage for the switch driver based on the digital logic signal.

22. The method of claim 16, further comprising sensing a voltage of the first node in a second DAC cell, wherein the controlling comprises controlling the power supply voltage for the switch driver in the at least one of the plurality of DAC cells based on the sensed voltage of the first node in the first DAC cell and on the sensed voltage of the first node in the second DAC cell.

23. The method of claim 22, wherein:
the current source is a cascoded current source comprising a first transistor and a second transistor, the second transistor having a source coupled to a drain of the first transistor at a second node;
the method further comprises sensing a voltage of the second node in the first DAC cell and a voltage of the second node in the second DAC cell; and
the controlling comprises controlling the power supply voltage for the switch driver based on a first voltage difference between the voltage of the first node in the first DAC cell and the voltage of the second node in the first DAC cell and on a second voltage difference between the voltage of the first node in the second DAC cell and the voltage of the second node in the second DAC cell.

24. The method of claim 16, wherein the controlling comprises providing the power supply voltage to a last stage of the switch driver in the at least one of the plurality of DAC cells.

25. The DAC of claim 13, wherein the power supply voltage is provided to a last stage of the switch driver in the at least one of the plurality of DAC cells.

26. A wireless device comprising the DAC of claim 13, the wireless device further comprising:
one or more antennas; and
one or more transmit paths coupled between one or more outputs of the DAC and the one or more antennas.

* * * * *